United States Patent
Smith et al.

[11] Patent Number: 5,807,453
[45] Date of Patent: Sep. 15, 1998

[54] FABRICATION OF LEADS ON SEMICONDUCTOR CONNECTION COMPONENTS

[75] Inventors: John W. Smith, Palo Alto; Joseph Fjelstad, Sunnyvale, both of Calif.

[73] Assignee: Tessera, Inc., San Jose, Calif.

[21] Appl. No.: 634,784

[22] Filed: Apr. 19, 1996

Related U.S. Application Data

[63] Continuation-in-part of Ser. No. 434,552, May 4, 1995, Pat. No. 5,679,194.

[51] Int. Cl.⁶ ............................................. H05K 3/32
[52] U.S. Cl. ....................... 156/150; 156/250; 29/827; 29/884
[58] Field of Search ........................ 156/150, 151, 156/250; 29/847, 845, 842, 850, 827, 874, 884, 877; 216/13, 14, 20; 256/668; 361/813; 174/59

[56] References Cited

U.S. PATENT DOCUMENTS

| | | | |
|---|---|---|---|
| 3,129,280 | 4/1964 | Elarde | 29/846 |
| 3,778,900 | 12/1973 | Haining et al. | 29/846 |
| 3,971,661 | 7/1976 | Lindberg et al. | 427/97 X |
| 4,107,836 | 8/1978 | Roberts | 29/846 |
| 4,891,014 | 1/1990 | Simpson et al. | 29/846 |
| 5,419,038 | 5/1995 | Wang et al. | 29/830 |

FOREIGN PATENT DOCUMENTS

| | | |
|---|---|---|
| 3276653 | 12/1991 | Japan . |
| WO 94/03036 | 2/1994 | WIPO . |

*Primary Examiner*—Francis J. Lorin
*Attorney, Agent, or Firm*—Lerner, David, Littenberg, Krumholz & Mentlik

[57] ABSTRACT

A substantially continuous layer of a first metal such as copper is provided with strips of a second metal such as gold by selective electroplating of the second metal, or by applying separately formed strips such as lengths of wire. A dielectric support layer is provided in contact with the first metal layer, and the first metal layer is etched to leave strips of the first metal contiguous with the strips of the second metal, thereby providing composite leads with the first and second metal strips connected in series. The process provides simple and economical methods of making microelectronic connection components with leads having a flexible, fatigue resistant lead portion formed from a precious metal. The leads may incorporate sections of round cross-sectional shape to facilitate engagement by a bonding tool during use of the component.

19 Claims, 9 Drawing Sheets

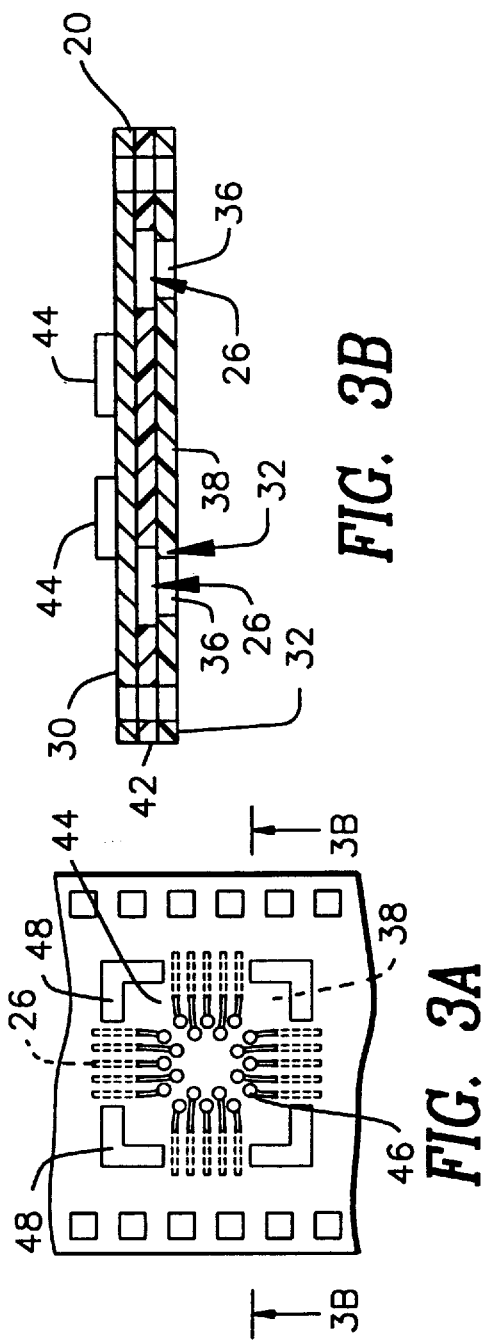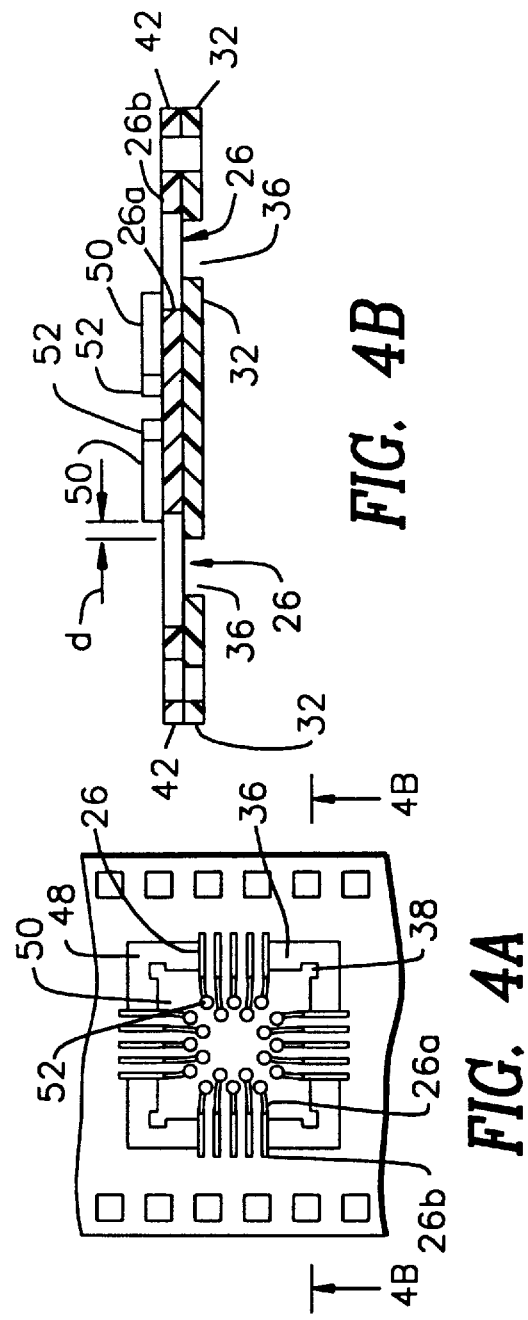

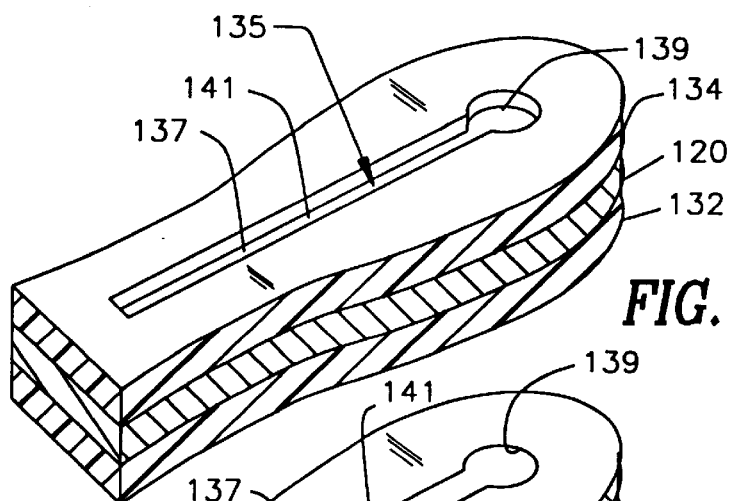
FIG. 8
FIG. 9
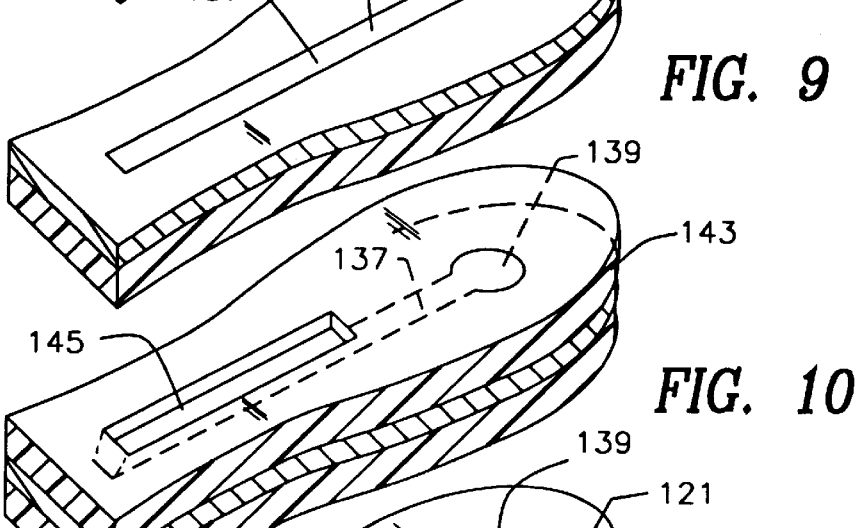
FIG. 10
FIG. 11
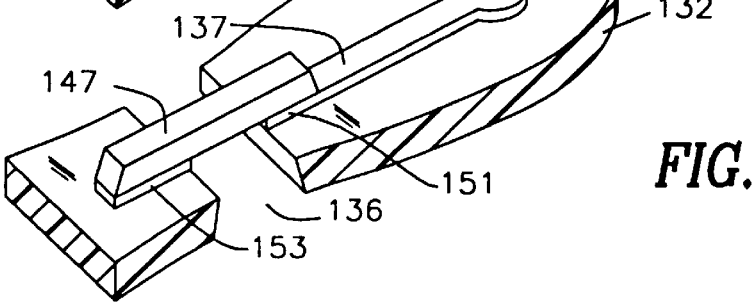
FIG. 12

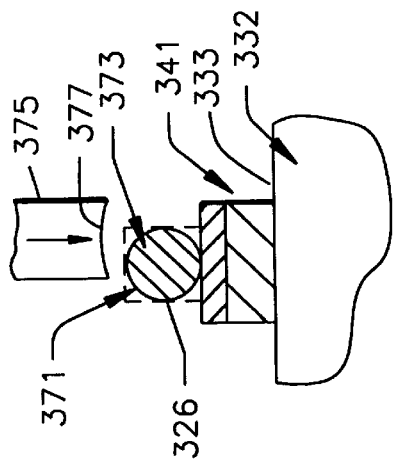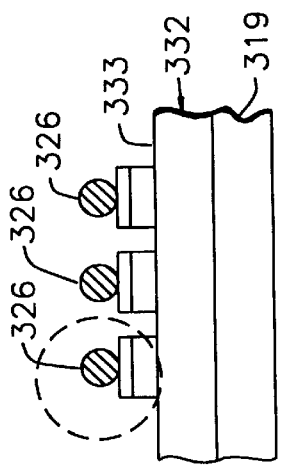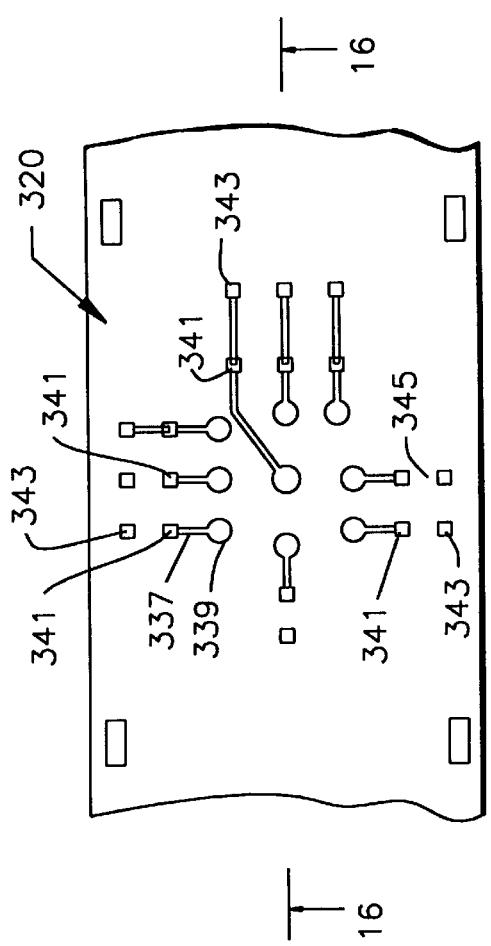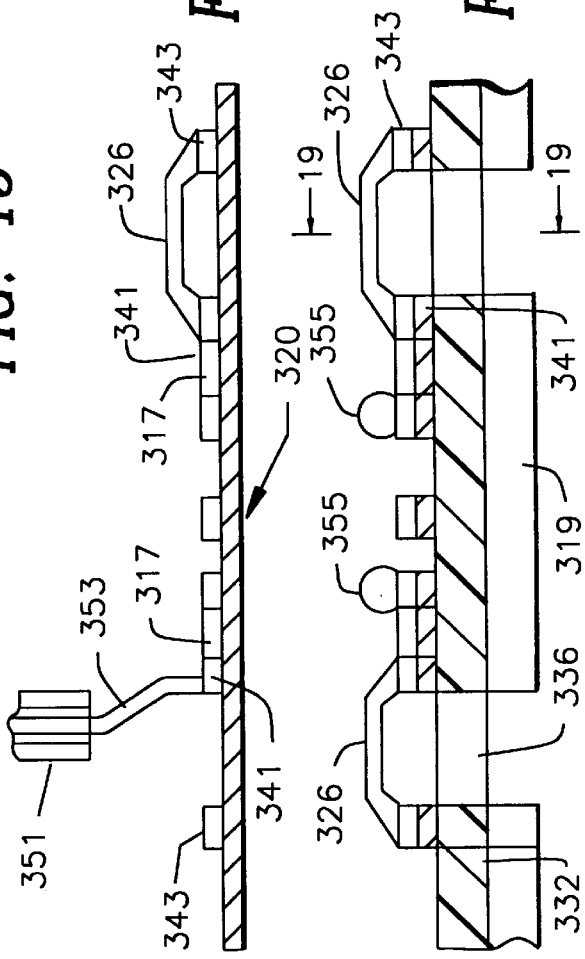
FIG. 20
FIG. 19
FIG. 15
FIG. 16
FIG. 17

FABRICATION OF LEADS ON SEMICONDUCTOR CONNECTION COMPONENTS

CROSS REFERENCE TO RELATED APPLICATIONS

This application is a continuation-in-part of U.S. patent application Ser. No. 08/1,434,552, filed May 4,1995, the disclosure of which is hereby incorporated by reference herein.

FIELD OF THE INVENTION

The present invention relates to methods of making connection components for semiconductor chips and other microelectronic devices, and to the connection components made thereby.

BACKGROUND OF THE INVENTION

Microelectronic components such as semiconductor chips typically are connected to external circuitry through contacts on the components as, for example, contacts on the surface of a semiconductor chip. Various processes have been proposed for connecting these contacts with circuits on an external substrate such as a circuit panel or multichip module base. In a wire bonding process, the chip is physically mounted to the substrate. A fine wire is fed through a bonding tool. The tool is engaged with a contact on the chip so as to bond the wire to the contact of the chip. The tool is then moved to a connection point on the substrate while paying out a wire through the tool, so that a small piece of wire is dispensed and formed into a lead. The tool then bonds this lead to the connection point on the substrate. This process is repeated for each contact on the chip.

In the so-called tape automated bonding or "TAB" process, a dielectric supporting tape such as a thin film of polyimide is provided with a hole slightly larger than the chip. An array of metallic leads is provided on one surface of the tape. These leads extend inwardly across the edges of the hole. The innermost ends of the leads are arranged side-by-side at spacings corresponding to the spacings of the contacts on the chip. The tape and leads are juxtaposed with the chip so that the hole is aligned with the chip and so that the innermost ends of the leads extend over the contact-bearing surface of the chip. The innermost ends of the leads are then bonded to the contacts of the chip by ultrasonic or thermosonic or thermocompression bonding processes. The outer ends of the leads are connected to the external substrate.

The wire bonding and TAB processes suffer from significant drawbacks, which become more severe as the number of contacts on the chip increases and the distances between contacts on the chip decrease. For example, the TAB process encounters substantial difficulties with contact spacings less than about 100 microns. As disclosed in commonly assigned International Patent Publication WO 94/03036, the disclosure of which is hereby incorporated by reference herein, new connection methods substantially overcome these drawbacks. In preferred methods according to the '036 publication, a connection component includes a dielectric support structure such as a polyimide or other polymeric sheet defining gaps such as holes or elongated slots. Leads are provided on the support structure. Each lead has an elongated connection section extending across a gap in the support structure. A first end of each connection section is permanently secured to the support structure, and is connected to a terminal disposed on the support structure. The second end of each connection section, disposed on the opposite side of the gap, is mounted to the support structure so that such second end can be displaced downwardly relative to the support structure. For example, each lead may be provided with a frangible section such as a narrow portion, and the second end of each connection section may be attached to the support structure through the frangible section. In another arrangement also taught in the '036 publication, the second end of each connection section can be weakly bonded to the support structure. Because all of the lead connection sections are supported at both ends prior to connection to the chip, the connection sections can be positioned with good accuracy relative to the contacts on the chip by positioning the support structure on the chip. In a bonding operation, each lead desirably is engaged by a bonding tool and guided into even more precise alignment with the contact on the chip by the bonding tool itself. As each lead is bonded to a chip contact, it is forced downwardly relative to the support structure, and bent downwardly until it engages the chip contact. This action displaces the second end of the support structure. Where the second end of the connection section is detachably connected to the support structure, the downward movement of the connection section imparted by the tool breaks the attachment between the second end of the connection section and the support structure, as by rupturing the frangible section or breaking the bond between the second end of the connection section and the support structure.

Connection components and methods according to the aforementioned '036 Publication substantially overcome many of the drawbacks associated with conventional connection methods. For example, such components and methods can be used to connect chips having closely spaced contacts. Although the connection component according to the '036 Publication can be fabricated readily using the procedures described therein, still further improvement would be desirable. For example, it is particularly desirable to form the connection sections of the leads from gold or other malleable precious metals to provide enhanced flexibility and fatigue resistance in the connection sections, and to provide maximum oxidation resistance. However, for minimum cost, the other sections of the leads should be formed from less expensive metals. Also, the process used to make the leads should include the fewest possible steps. Further, although the '036 publication discloses certain arrangements in which the second end of the connection section is releasably attached to the support structure without use of a frangible section, further improvements in such non-frangible releasable connections would be desirable.

SUMMARY OF THE INVENTION

The present invention addresses these needs.

One aspect of the present invention provides methods for making a connection component for a microelectronic element. Methods according to this aspect of the invention desirably include the steps of providing a substantially continuous layer of a first metal, typically an economical, etchable base metal such as copper or a copper alloy, and selectively depositing a plurality of conductive portions of a second metal on the first metal layer. The second metal may be deposited in elongated strips, and may be a malleable precious metal such as a gold alloy or, preferably, substantially pure gold. The methods according to this aspect of the invention further include the step of providing a dielectric support juxtaposed with the first metal layer and selectively removing the first metal after selectively depositing the second metal conductive portions or strips. The selective removal forms a plurality of conductive portions from the first metal. The conductive portions of the first metal formed during the selective removal step are contiguous with the conductive portions of the second metal. The conductive portions of the second metal and first metal thus form a plurality of composite leads, each such composite lead including conductive portions of the first and second metals connected to one another. Thus, the conductive portions of the first metal formed by the selective removal step may include a plurality of elongated strips of the first metal, and the depositing and removing steps may be performed so that at least some of the composite leads include strips of the first and second metal connected in series with one another.

The process may further include the step of providing gaps in the dielectric support registered with the strips of the second metal so that the strips of the second metal extend across the gaps. Thus, the strips of the second metal may constitute the connection sections of leads in an arrangement as disclosed in the '036 Publication, whereas the sections formed from the first metal may constitute the remainder of the leads. The composite leads provide the desired flexibility and fatigue resistance in an economical construction. Preferably, the selective depositing step is performed by electroplating the second metal, such as gold, unto the continuous sheet of the first metal or copper, using a mask layer with apertures corresponding to the desired locations of the second metal.

The step of selectively removing the first metal may be performed by etching the first metal layer, desirably after selectively masking the first metal layer. In certain embodiments of the invention, the entire process of forming the composite leads includes only one plating step and only one etching step. The step of providing the dielectric support may include the step of laminating the dielectric support to the first metal layer after depositing the strips of the second metal, and, preferably, before etching the first metal. The gaps may be provided in the dielectric support by providing the gaps in the support before the laminating step. The laminating step may be performed so as to align the gaps with the strips of the second metals. The method may further include the step of punching the laminated second metal and dielectric support after the laminating step but before the step of selectively removing the first metal so as to form punched holes continuous with the gaps in the support. During the punching process, the first metal layer reinforces the dielectric support so that the same may be effectively and cleanly cut by the punches. The punching operation may form holes continuous with the gaps, so that the gaps and holes are joined into a continuous slot encircling a central portion of the dielectric support structure. Alternatively, the gaps in the dielectric support can be formed after the laminating step, as by laser ablation or chemical etching. In a particularly preferred arrangement, the strips of the second metal are deposited on a first side of the first metal layer and this first side of the first metal layer faces towards the dielectric support during and after the laminating step. An adhesive may be provided between the first side of the first metal layer and the dielectric support. Thus, after the laminating step, and after the etching step as well, one end of each second-metal strip will be embedded in the adhesive and hence releasably connected to the dielectric support layer. The other end of each second metal strip will be connected to the remainder of the lead, including the first metal, and hence will be securely anchored to the dielectric support layer. Thus, the process forms the releasable connections as well with the simple plating and etching process.

There is no need to form fine features which provide frangible sections in the leads, and no need for additional operations with precise process control.

In other methods according to the invention, the dielectric support and the metal layer are pre-formed so as to provide the continuous first metal layer on the dielectric support prior to the other steps of the process. The strips of the second metal are deposited on the first surface of the first metal layer, facing away from the dielectric support. A process according to this aspect of the invention may include the step of selectively depositing a thin flash layer of an etch-resistant metal in a plurality of flash regions. The step of selectively removing the first metal to form the first metal portions of the leads may include the step of exposing the first metal layer to an etchant, in which case the flash metal protects the first metal from the etchant in regions corresponding to the first metal conductive portion. Each flash region may include an elongated strip section. The step of depositing the second metal strips may include the step of depositing the second metal on such a strip section of the flash region. Thus, each flash region may be partially masked prior to depositing the second metal so as to leave at least part of the strip portion of each flash region unmasked, but mask other portions of each flash region. The process may further include the step of forming gaps in the dielectric support layer aligned with the strips of second metal after depositing such strips. After forming the gaps, the first metal layer, with the flash regions and the second metal strips thereon may be exposed to an etchant, so as to form the first metal layer into lead portions contiguous with the strips of the second metal. As in the other embodiments discussed above, the entire composite lead structure may be formed by a simple process, in this case including two plating steps and one etching step. Here again, there is no need to form a particularly fine features to make frangible sections and no need for complex sequences of operations.

The step of depositing the second metal can be performed either by a progressive deposition process such as electroplating, or by attaching preexisting strips of the second metal. In one arrangement, strips of the second metal are formed from lengths of wire. The preexisting strips or wire lengths may be attached to the first metal sheet at spaced-apart bonding pad areas of the first metal layer, using bonding processes such as thermosonic bonding or other suitable processes for forming a metallurgical bond. A first such bonding pad area is contiguous with those regions of the first metal layer which will form lead portions after the first metal is selectively removed. The second bonding pad area used for attachment of each strip is remote from the lead-forming regions of the first metal layer, and lies on the opposite side of the gap from the first bonding pad area at the conclusion of the process. Thus, at the conclusion of the process, each second metal strip will bridge across the gap and form the connection section of the composite lead.

Formation of the connection sections of the leads from preexisting strips provides several advantages. This process avoids the need for electroplating or other progressive deposition of relatively thick sections of the second metal, and thus saves considerable time in processing. Moreover, the cross-sectional shape of the preexisting strips is not restricted by the deposition process. In a particularly preferred embodiment, the preexisting strips are formed from lengths of wire having a round cross-section, thereby forming connecting sections of round cross-section. As further discussed below, connection sections having round cross-sections facilitate engagement and positioning of the connection section by a bonding tool during use of the connection component.

The individual wire lengths may be connected to the bonding pad areas using methods and apparatus similar to those employed in a wire bonding procedure commonly referred to a stitch bonding.

After selective removal of the first metal layer, the second bonding pad area may form a relatively small, isolated second bonding pad, which is only attached to the underlying dielectric support layer over a small area. By contrast, the first bonding pad area forms a first bonding pad integral with the other lead portions formed from the first metal layer. The second end of the connection section formed from the preexisting strip is thus releasably attached to the dielectric support layer, whereas the first end is permanently anchored to the dielectric support layer and permanently connected to the remainder of the lead.

The bonding pad areas may be covered by a thin flash coating as discussed above including one or more metals adapted to resist etching or other removal processes. The flash metals used in the bonding pad areas preferably also facilitate bonding of the strips and resist diffusion of the first and second metals to retard formation of brittle intermetallic compounds.

In a process according to further aspects of the invention, the order of steps is reversed. After the first metal layer is laminated to the dielectric support layer, the first metal layer is selectively removed, as by etching, to leave lead portions each contiguous with a first bonding pad and second bonding pads isolated from the lead portions. Preexisting strips such as the wires discussed above are then bonded to the bonding pads and dielectric support layer is selectively removed to form the gaps.

Yet another aspect of the present invention provides a connection component incorporating a dielectric support layer having a gap therein and incorporating one or more leads, each having a connection section extending across the gap. In the connection component according to this aspect of the invention, at least a portion of each connection section is an elongated strip having a cross-sectional shape which is at least partially round and which defines curved lead-in surfaces facing in an upward direction relative to the support layer. In a particularly preferred embodiment, each connection section is formed from a wire having a completely round cross sectional shape. As further discussed below, the curved lead-in sections facilitate engagement of the connection section by a bonding tool when the bonding tool is advanced downwardly to engage the lead and bond it to a contact.

These and other objects, features and advantages of the present invention will be more readily apparent from the detailed description of the embodiments set forth below, taken in conjunction with the accompanying drawings.

BRIEF DESCRIPTION OF THE DRAWINGS

FIGS. 3a and 3b are, respectively, top plan and sectional views showing the layers of FIGS. 1 and 2 united with one another at a later stage of the process.

FIGS. 4a and 4b are, respectively, top plan and sectional views showing the components at a later stage in the process.

FIG. 8 is a perspective view depicting a portion of a component during the process in accordance with yet another embodiment of the present invention.

FIGS. 9 through 12 are views similar to FIG. 8 but depicting the component during progressively later stages of the same process.

FIG. 15 is a diagrammatic plan view depicting a portion of a component in accordance with yet another embodiment of the invention during one process step.

FIG. 16 is a diagrammatic sectional view taken along line 16—16 in FIG. 15.

FIG. 17 is a sectional view similar to FIG. 16 but depicting the component after completion of the process.

FIG. 19 is a diagrammatic sectional view taken along line 19—19 in FIG. 17.

FIG. 20 is a fragmentary view on an enlarged scale depicting a portion of the component illustrated in FIG. 19.

Figure 18:
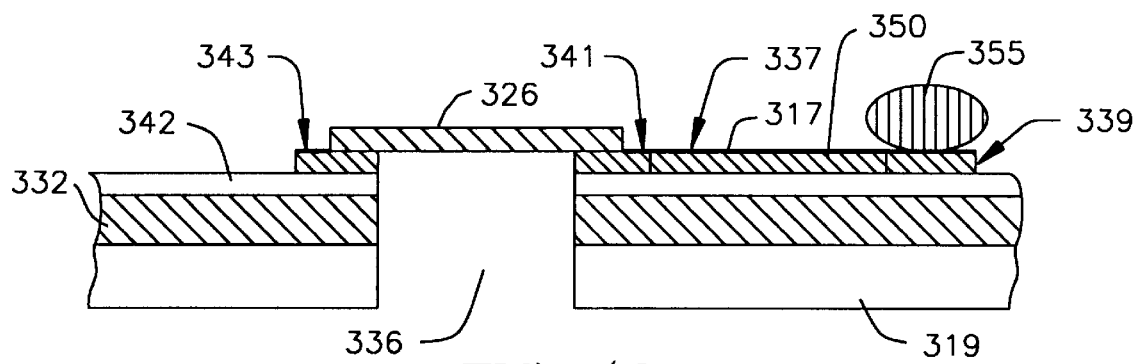
FIG. 18 is a sectional view on an enlarged scale depicting a portion of the component illustrated in FIG. 17.
Figure 21:
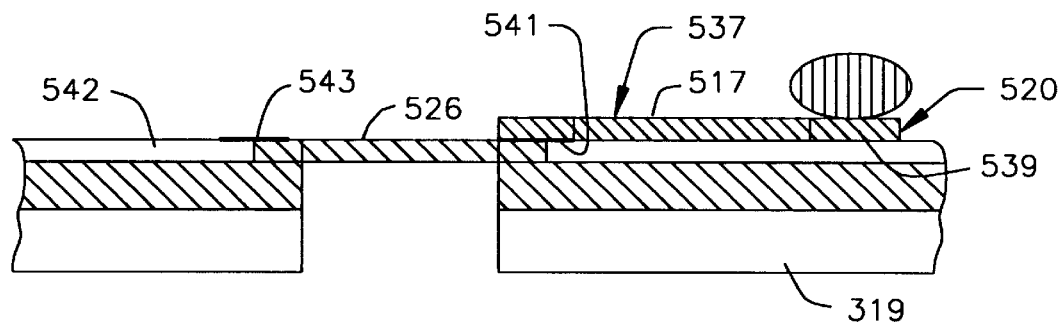
Figure 22:
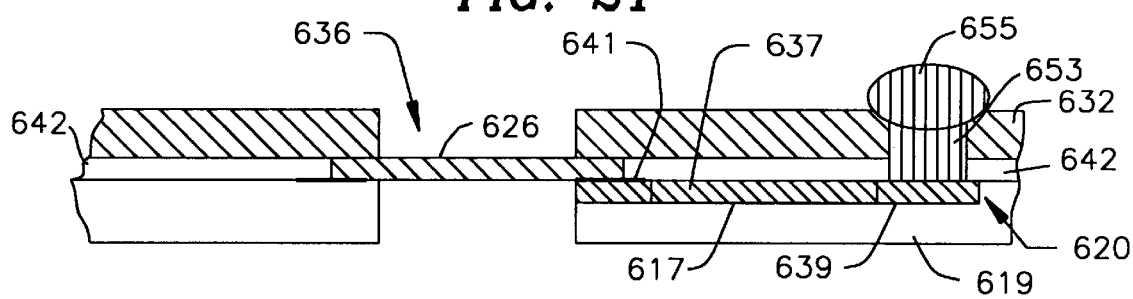
Figure 23:
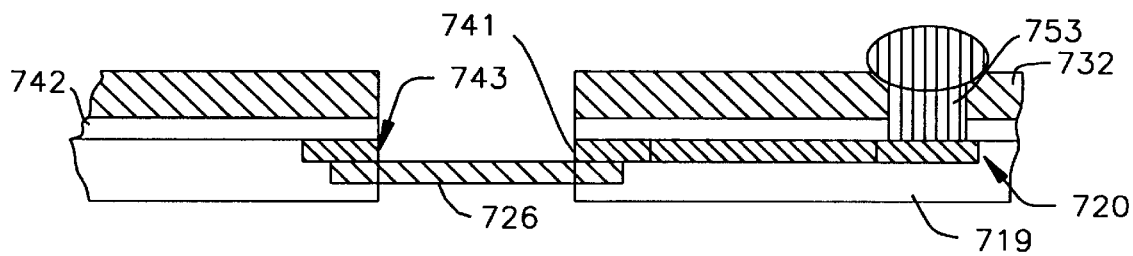

Each of FIGS. 21, 22 and 23 is an enlarged sectional view similar to FIG. 18 but depicting portions of components according for further embodiments of the invention.

Figure 24:
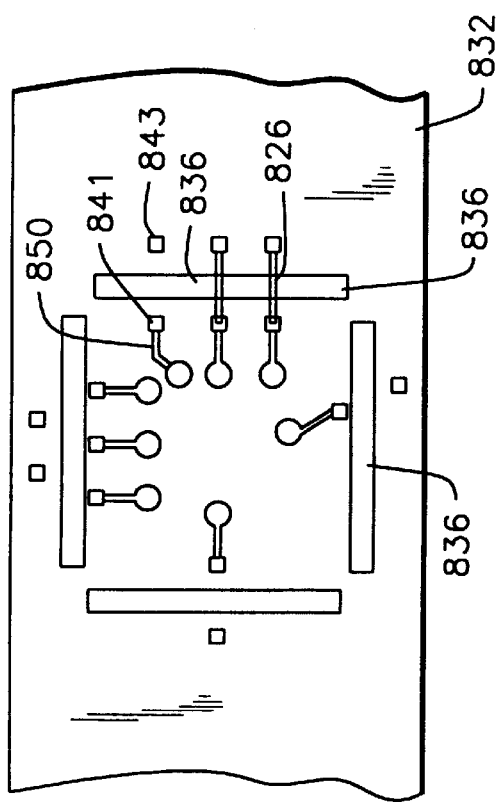

FIG. 24 is a plan view depicting portions of a component in accordance with yet another embodiment of the invention during a process of manufacture.

Figure 25:
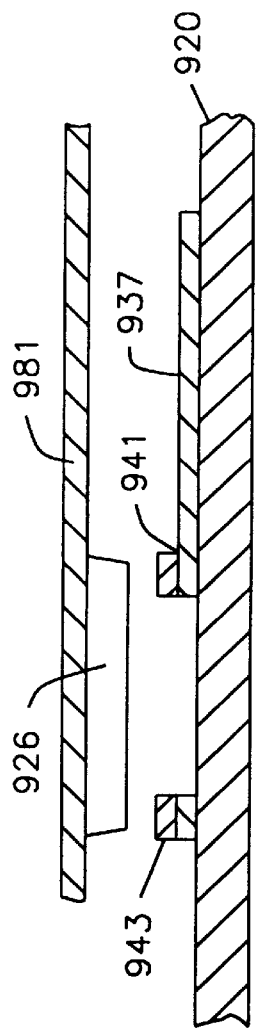

FIG. 25 is a fragmentary sectional view depicting portions of a component in accordance with yet another embodiment of the invention.

Figure 26:
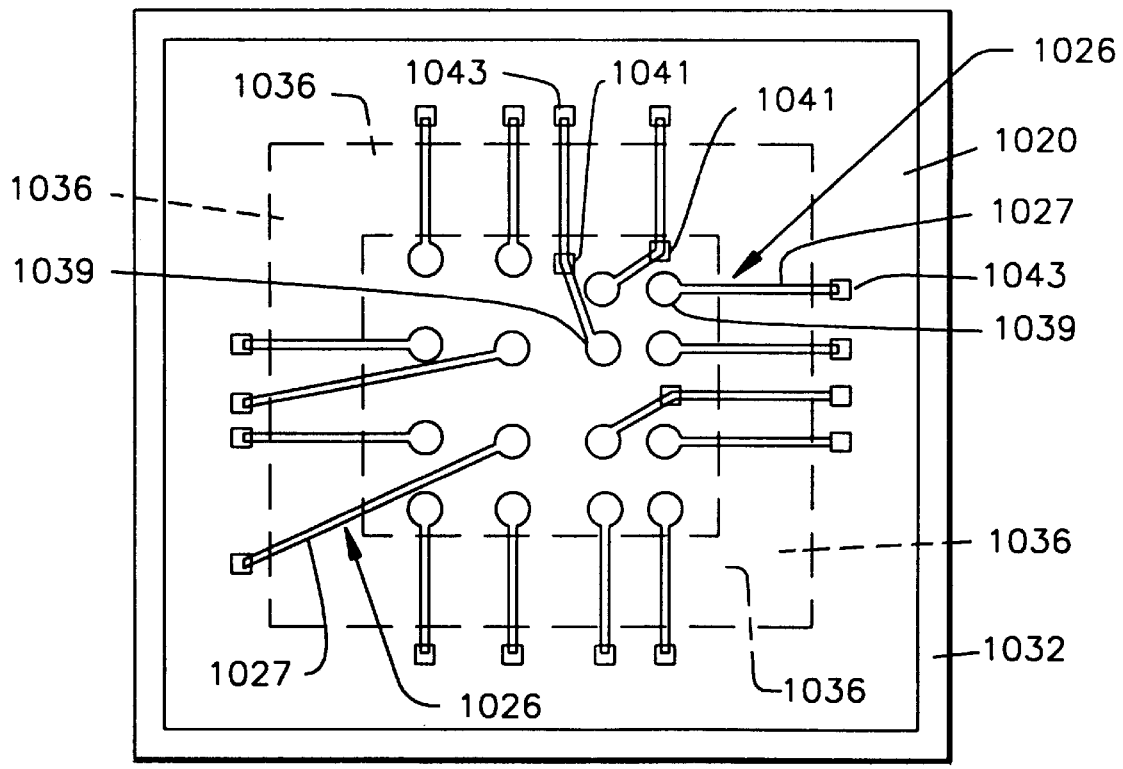

FIG. 26 is a diagrammatic plan view depicting a component according to yet another embodiment of the invention.

DETAILED DESCRIPTION OF THE PREFERRED EMBODIMENTS

A process in accordance with one embodiment of the present invention begins with a layer 20 of copper. The copper desirably is between about 5 and 50 microns thick. Copper layer 20 desirably is in the form of an elongated tape having lengthwise edges 22 and having sprocket holes or alignment holes 24 extending through the layer adjacent the edges. The region of the tape between the rows of alignment holes 24 desirably is substantially continuous. As used in this disclosure with reference to a layer, the term "substantially continuous" means that the material of the layer occupies at least about 50 percent of the surface of the layer. That is, such a layer may have holes or apertures therein, but desirably the holes or apertures occupy less than half of the surface area of the layer. Most preferably, the region of layer 20 between the sprocket holes is entirely continuous and imperforate and has no holes or apertures. Only a small portion of the length of the copper tape is shown. The portion shown corresponds to the portion required to form one connection component. The copper tape typically is of indefinite running length, and incorporates many such portions.

In the first stage of the process, strips 26 of pure gold, desirably about 10 to about 50 microns thick and about 10 to about 50 microns wide are deposited on a first or top surface 28 of layer 20 by a selective electroplating process. The selective electroplating process may incorporate the steps of applying a resist, such as a common photographically patternable plating resist (not shown), onto first surface 28 and patterning the resist to provide holes at the locations where strips 26 are to be formed. A non-selective, non-patterned resist (not shown) is used to cover the entire second surface 30 of layer 20. Strips 26 are then formed by immersing the resist-covered layer 20 into a gold electro-plating bath and applying an electroplating potential. Continuous layer 20 conveys the plating current to the locations of all of strips 26. Strips 26 are formed in rows disposed in a substantially rectangular array, with the strips in each row extending side-by-side and parallel with one another. Strips 26 are formed at preselected positions relative to alignment holes 22. After plating strips 26, the photoresists are removed from layer 20.

A dielectric support tape 32 is formed from a polymeric material such as a polyimide film between about 15 and about 50 microns thick, and most desirably about 25 microns thick. Tape 32 has alignment holes or sprocket holes 34 corresponding to the alignment holes 24 in first metal layer 20. Tape 32 also has a set of elongated gaps 36 extending in a generally rectangular pattern substantially surrounding a central portion 38 of the tape. The central portion 38 of the tape, however, is connected by webs 40 at the corners of the rectangular gap pattern to the peripheral region of the dielectric support layer or tape, adjacent the alignment holes 34. Gaps 36 are disposed in preselected positions relative to the alignment holes 34 in the dielectric support layer. The dielectric support layer or tape 32 is also provided with a layer of an adhesive 42 covering its top surface. Adhesive layer 42 desirably is formed from a heat-activatable, rapidly curable adhesive. For example, the adhesive can be of the type commonly referred to in the semiconductor industry as a "snap cure" adhesive. Alternatively, the adhesive may be a thermoplastic material such as polyetherimide. The thermoplastic material is adapted to soften upon application of heat, and then form a solid bond upon cooling.

In the next stage of the process, first metal layer 20 is laminated to dielectric layer 32 using heat and pressure appropriate to activate and cure adhesive 42. Alignment holes 22 and 34 in the metal and dielectric layers are engaged with an appropriate fixture (not shown) to bring these holes into registration with one another and thereby bring strips 26 into registration with gaps 36. The first side 28 of the metal layer, with strips 26 thereon faces towards the dielectric layer 32 and engages the adhesive layer 42. Thus, the adhesive layer 42 is sandwiched between first metal layer 20 and the dielectric support layer 32. Strips 26 are aligned with the gaps 36 in the polymeric layer. The ends of each strip are embedded in adhesive layer 42. Each strip 26 bridges over one gap 36, so that the ends of each such strip are positioned on dielectric layer 32. During the lamination process, the assembly is brought to a substantially planar condition as first metal layer 20 and dielectric layer 32 are pressed between opposing surfaces of the fixture. The adhesive layer may deform or flow to compensate for irregularities in the metal layer or in the polymer layer. After lamination, the assembly is punched using a conventional mechanical punch press and matched die set to form holes 48 at the corners of the rectangular gap array. Holes 48 are continuous with gaps 36 in the dielectric support layer 32, and thus form a continuous channel surrounding the central region 38 of the dielectric support layer. During the punching process, metal layer 20 reinforces the dielectric layer. This facilitates formation of holes 48 without tearing or deforming the dielectric layer. Thus, all of the other features of the dielectric layer remain precisely located in their original positions.

Following the punching step, strips of a further photoresist 44 are deposited on the second surface 30 of first metal layer 20, so that each such strip 44 has an end overlying one end of a second metal or gold strip 26. Each such strip of photoresist 44 extends away from the associated gold strip 26. At the end of each strip 44 remote from the second metal or gold strip 26, there is a round head or terminal-forming spot 46. The photoresist strips are applied and patterned in the conventional manner, as by depositing a layer of photoresist, developing the resist selectively using photographic processes and removing undeveloped portions of the resist. After application of resist strips 44, the entire assembly is subjected to an etchant with attacks the copper in layer 20 but does not attack the gold in strips 26, such as a $HCl/CuCl_2$ etchant. This removes all of layer 20 except those regions of the layer covered by resist strips 44 and by terminal forming spots 46. After this etching process, resist strips 44 and spots 46 are removed by conventional resist removal processes.

The etching process removes essentially all of the original first metal layer 20 except for individual strips or connector portions 50 and terminals 52. As seen in FIGS. 4a and 4b, each first metal or copper strip 50 is in continuous, substantially end-to-end series connection with one gold or second metal strip 26, with a small lap joint between the first metal and second metal strips. Thus, each copper strip 50 and the associated gold strip 26, form a composite lead having gold and copper portions connected in series, and having the gold portion disposed at the end of the composite lead remote from terminal 52. Each gold strip 26 is aligned with a gap 36 in the dielectric layer. The first metal connector portions or strips 50, and terminals 52 are disposed on the central portion 38 of the dielectric layer. Each gold strip or second metal strip 26 has a first end 26a connected to the associated first metal or copper strip 50. The first end 26a of each gold strip is disposed on one side of the associated gap 36 in layer 32. Each gold strip also has a second end 26b remote from the associated copper strip 50 and disposed on the opposite side of the associated gap 36. Each copper strip 50 covers a substantial area of the adhesive layer 42 and hence is securely fastened to the dielectric layer 32. The first end 26a of each gold strip is securely anchored by its metallurgical bond to the associated copper strip 50. However, the second end 26b of each gold strip 26 is only lightly anchored to the peripheral region of the dielectric layer by adhesive surrounding the end. Such adhesive grips of the second end 26b over only -a minuscule area. The bond between each second end 26b is secure enough to hold the lead in place during handling and during assembly with a semiconductor chip. However, the bond at each second end 26b is readily releasable. In the finished condition illustrated in FIGS. 4a and 4b, the central region 38 of the dielectric layer is connected to the peripheral region only through the leads and, in particular, only through the connection sections or gold strips 26 of the composite leads.

The component fabricated according to the foregoing process can be utilized in connection methods as disclosed in the aforesaid International Patent Publication WO 94/03036. Thus, the connection component can be juxtaposed with a semiconductor chip (not shown) so that rows of contacts on the semiconductor chip are aligned with the gaps 36 in the dielectric layer and so that the gold strips or connection sections of the leads are aligned with contacts on the chip. A bonding tool can be advanced to engage each connection section, force the connection section downwardly into the gap and bond the connection section to the appropriate contact on the chip. As described in the '036Publication, the bonding tool desirably brings each connection section into more precise alignment with the contact. During the downward motion, the second end 26b of the lead will be detached from the support layer 32, whereas the first end 26a will remain in place. As the leads are bonded, the central portion 38 of the dielectric layer becomes detached from the peripheral portion, so that the peripheral portion with alignment holes 26, may be removed. As further disclosed in the aforesaid '036 publication, a compliant layer (not shown) may be provided between the dielectric layer and the chip to facilitate compensation for thermal expansion and also to facilitate moveability of terminals 52 toward and away from the chip so that such vertical movement can compensate for irregularities and non-planarities during testing and assembly to other components. The completed assembly provides the benefits discussed in the '036 publication, including good compensation for thermal expansion. Such compensation is provided in part by flexure of the connection sections 26. Because the connection sections are formed from pure gold the same will remain flexible and substantially fatigue-resistant. However, because at least a portion of each composite lead is formed from the economical first metal or copper 50, the amount of gold required in the component is substantially less than that which would be required to form the entirety of each lead from gold. Additionally, the adhesive surrounding the first end 26a of each gold strip is believed to enhance the fatigue resistance of the gold strip by minimizing stress concentrations at the junctures between the strips and the dielectric support layer. To further enhance fatigue resistance of the joints between the gold strips 26 and the copper strips 50, each such joint desirably is recessed from the edge of the gap 36. Thus, the widths and positions of gaps 36 are selected so that there is a small horizontal distance d between the edge 36a of each gap and the adjacent joints between gold and copper strips. Additionally, a barrier layer of a metal such as nickel can be applied selectively at the regions where the gold strips join the copper layer in a further, brief plating operation. Such a barrier layer prevents alloying of gold and copper and thus prevents formation of brittle intermetallic compounds. The entire process is accomplished with few steps. The process can be accomplished using essentially the same equipment as is normally used for formation of conventional TAB tape.

A process according to another embodiment of the invention utilizes a first metal layer 20' which has a substantially continuous barrier sublayer 21 on the first surface thereof. First metal layer 20' may be formed from a metal such as copper or a copper alloy, whereas barrier sublayer 21 is formed from a metal such as nickel adapted to retard interaction between the first metal and the second metal such as gold. Strips 26' of a second metal such as gold are selectively deposited onto the barrier sublayer and thus deposited on the first surface of the first metal layer 20'. The first metal layer, with the strips thereon, is then laminated to the top surface of a dielectric support layer 32' using an adhesive layer 42'. Once again, strips 26' are embedded in adhesive 42'. Prior to the lamination step, a ground plane metal layer 33 of an etchable metal such as copper is provided on the bottom surface of the dielectric support layer, as by plating or sputtering the ground plane metal layer onto the bottom surface. At this stage of the process, the support layer 32' does not have gaps.

After lamination of the first metal layer, strips of resist 44' are applied on the top or second surface of the first metal layer 20'. A further resist 35 is applied on the exposed surface of the ground plane layer in a pattern having gaps 37 aligned with the rows of second metal strips 26'. The first metal layer 20' and barrier layer 21 are then etched using an etchant, or series of etchants, adapted to remove both the first metal and the barrier metal. For example, sulfuric acid solutions will etch both copper and nickel. The same etchant attacks ground plane metal layer 33, and cuts slots 39 in the ground plane layer. After the etching step, gaps 36' are formed by laser ablation of the support layer 32' and of adhesive layer 42'. The laser ablation step may be performed by conventional methods, such as by use of a KrF laser. The laser ablation process may be controlled with reference to fiducial marks (not shown) deposited in the same plating process as strips 26', to thereby register the gaps 36' with strips 26'. Alternatively, gaps 36' may be formed by chemically etching the dielectric, using conventional methods such as an alkaline etch. The etching step may use ground plane layer 33 as an etching mask, or may use a further photographically patterned resist. Desirably, gaps 36' are narrower than the slots 39 in the ground plane layer, so that the ends of the leads cannot contact the ground plane layer when the lead ends are bent downwardly during use of the component. The resulting component is similar to the component discussed above. However, each first metal strip formed from layer 20' includes both the copper of the principal layer and the nickel of the barrier sublayer. The barrier layer retards diffusion and other interaction between the gold and copper at the joints between first metal and second metal strips.

Figure 7:
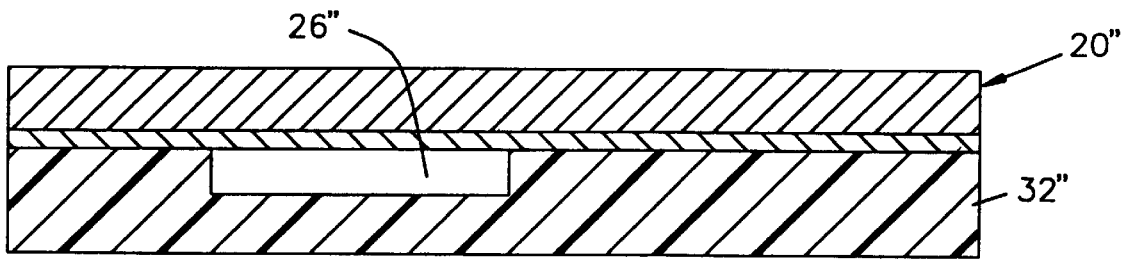
FIG. 7 is a view similar to FIG. 5 but depicting a component during a process in accordance with a further embodiment of the invention.

In a process according to a further embodiment, the second metal strips 26"are deposited on first metal layer 20" (FIG. 7) in the same manner as discussed above. After deposition of the second metal strips, the dielectric support layer 32" is formed in place on the first surface of the first metal layer 20" by coating the first surface with a flowable precursor liquid and then curing the precursor to form a cohesive layer. For example, to form a polyimide dielectric layer, the first surface of the first metal layer may be coated with polyamic acid and heat may be applied to convert the polyamic acid to polyimide. The liquid fills in around the second metal strips in much the same way as the adhesive used in other embodiments. Upon curing, the liquid bonds to the second metal strips and to the first metal layer. After curing, the dielectric layer is treated to form gaps in alignment with the second metal strips, and the first metal layer is masked and etched to form the first metal strips in the same way as discussed above. Here again, a first end of each second metal strip will be connected to a first metal strip and thus firmly fixed in place, whereas a second end of each second metal strip, on the opposite side of the gap, will be releasable held only by the bond with the cured dielectric or polyimide over the very small area at the end of the strip.

Figure 1B:
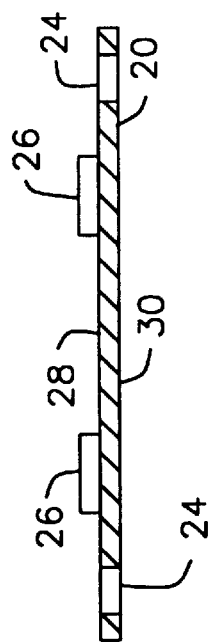
FIGS. 1a and 1b are, respectively, bottom plan and sectional views of a metal layer utilized in one embodiment of the present invention.
Figure 2B:
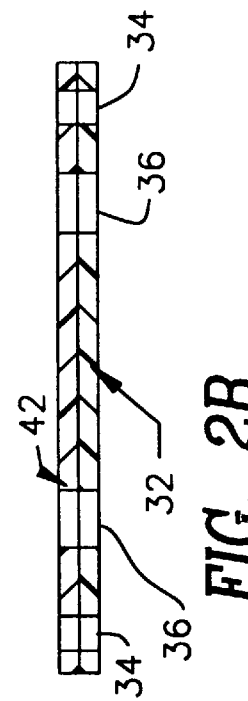
FIGS. 2a and 2b are, respectively, top plan and sectional views illustrating a dielectric support layer utilized with the metal layer of FIGS. 1a and 1b.
Figure 1A:
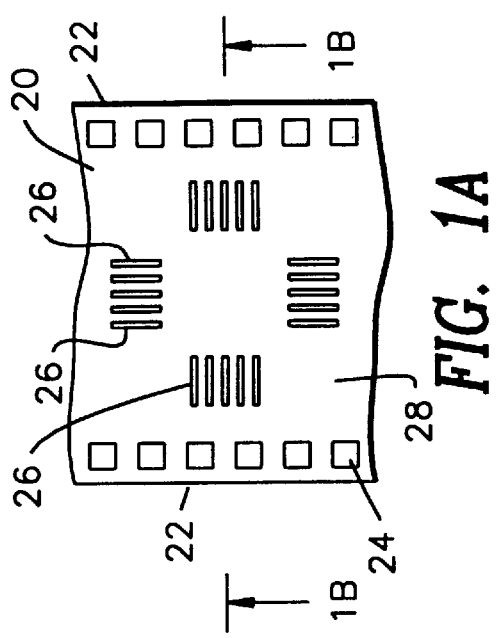
Figure 2A:
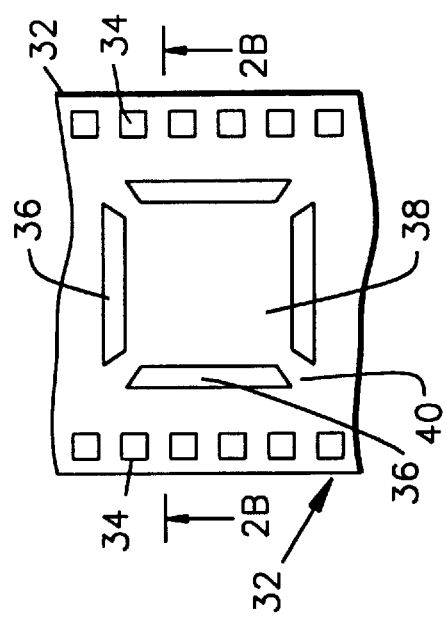
Figure 5:
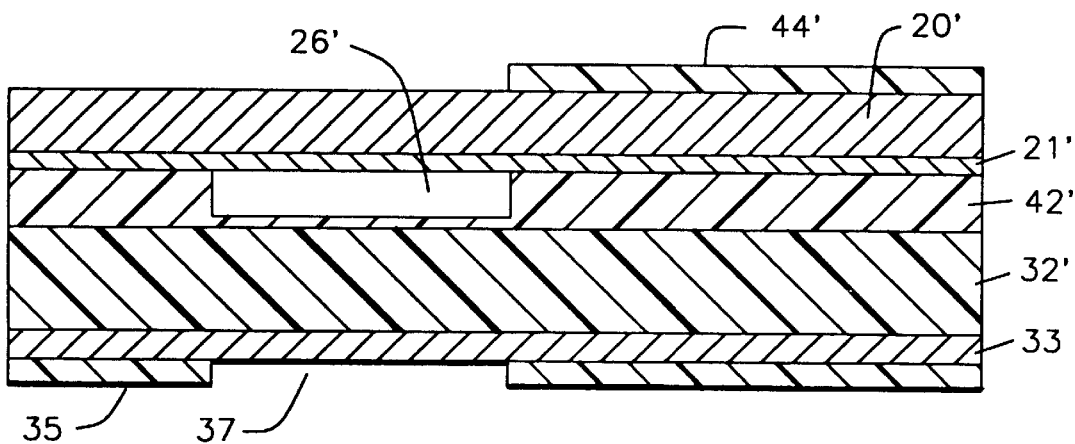
FIG. 5 is a fragmentary, diagrammatic sectional view depicting a portion of a component during a process in accordance with another embodiment of the invention.
Figure 6:
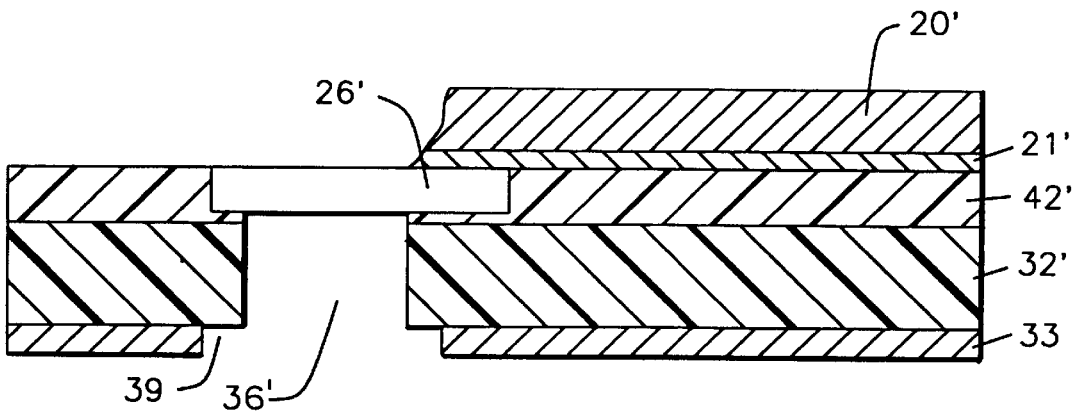
FIG. 6 is a view similar to FIG. 5 but depicting the component at a later stage in the process.

A process according to a further embodiment of the invention begins with a pre-laminated assembly of a substantially continuous metal layer 120 and a substantially continuous polymeric layer 132. Only a small portion of each such layer is illustrated in FIG. 8. The layers may be provided with alignment holes (not shown) similar to those discussed above in connection in FIGS. 1–4. Metal layer 120 may be provided on dielectric layer 132 by any conventional process, such as by laminating separately formed layers using an adhesive (not shown) or by plating metal layer 120 onto the surface of dielectric layer 132. Desirably, the laminating or plating process is selected to provide relatively good adhesion between layers 120 and 132. Thus, the peel strength of layer 120 relative to layer 132 should be about 7 to 15 pounds per linear inch (about $1.2 \times 10^6$ to $2.6 \times 10^6$ dynes/cm). A first photoresist 134 is applied to the top surface 121 of layer 120, facing away from dielectric layer 132. First photoresist 134 is patterned to provide numerous openings 135, each defining an elongated strip-like portion 137 and a spot or terminal portion 139. Although only one such opening 135 is shown, it should be appreciated that numerous such openings are formed, desirably in a rectangular pattern similar to the patterns of the strips shown in FIG. 1. A very thin coating or "flash" of an etch resistant metal 141, typically less than one micron thick, is applied in each opening 135 by a brief plating process. Metal 141 desirably is gold, or a barrier metal such as nickel which will retard diffusion of gold and copper. Here again, the continuous metal layer 120 provides electrical continuity for plating of all of the flash layers. The resulting flash regions have the same shape as openings 135; each includes an elongated strip-like portion 137 and a terminal spot 139.

Resist 134 is then stripped and a further resist 143 is applied on the top surface of layer 120. Resist 143 covers the terminal region 139 of each flash region and also covers a portion of the elongated strip region 137 of each flash layer. However, resist 143 has openings 145 aligned with portions of each strip-like region 137 remote from the terminal spot 139. After application of the resist, the assembly is immersed in a gold electroplating bath and gold strips 147, similar to the gold strips discussed above, are formed in the areas aligned with holes 135. Once again, the continuous metal layer 120 conveys the plating current to all of the areas undergoing electroplating.

Following formation of gold strips 147, slots or gaps 136 are formed in dielectric layer 132 by a selective removal process such as laser ablation or alkaline etching. Slots 136 are aligned with gold strips 147. Before or after formation of slots 136, resist 143 is removed. At this stage of the process, part of each flash region 141 remains exposed on the top surface 121 of metal layer 120. Each such exposed portion includes a part of the strip-like region 137 as well as the terminal region 139. Each strip-like region 137 is contiguous with one thick gold strip 147.

In the next stage of the process, the entire assemblage is immersed in an etchant which attacks the copper of layer 120 but which does not attack the gold of flash layer 141 or of strips 147. Here again, the etchant may be a $HCl/CuCl_2$ solution. The etch removes essentially all of layer 120 except those regions disposed between flash regions 141 or strips 147 and the dielectric layer 132. Thus, the copper layer remains in each strip region 137 and in each terminal 139. Also, a small portion 151 of the copper layer remains in the region underlying the first end of each gold strip 147, adjacent strip region 137. Each gold strip is thus contiguous with each such portion 151 and with the copper in elongated strip 137 and terminal 139. Also, a small portion of the copper layer remains in the region 153 underlying each strip at its end remote from the copper strip 137. However, the copper layer is removed in the regions aligned with gaps 136 in the dielectric layer 132. Thus, the connection section of the lead—the portion aligned with gap 136—consists essentially of pure gold. The portion 153 of the lead at the tip or second end of connection section 147 has such a small area that it can be readily detached from dielectric layer 132 when the connection section 147 is forced downwardly during use.

The process according to this embodiment thus also forms composite leads with only a few, relatively simple process steps. Strip portions 137 are composed essentially of the first metal or copper. The minor amount of gold present in the flash layer on these sections has a negligible effect on the cost of the assembly.

Figure 13:
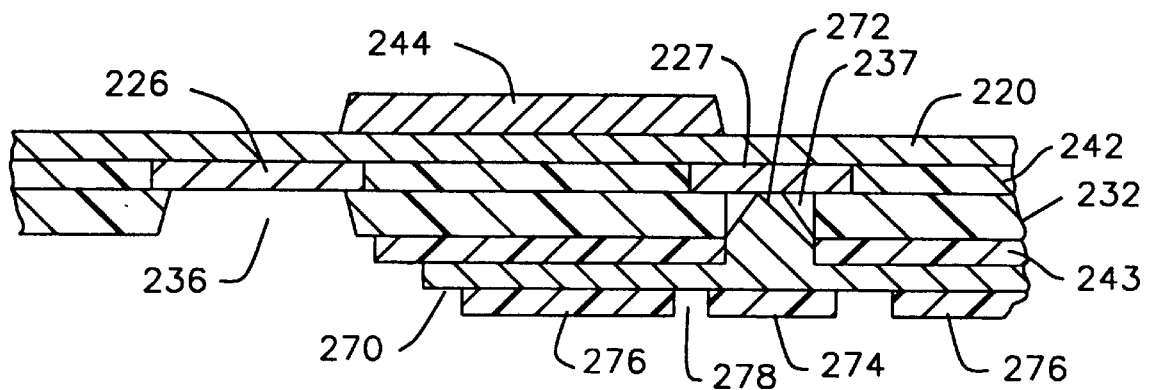
FIG. 13 is a fragmentary sectional view depicting a component during a process according to a further embodiment of the invention.
Figure 14:
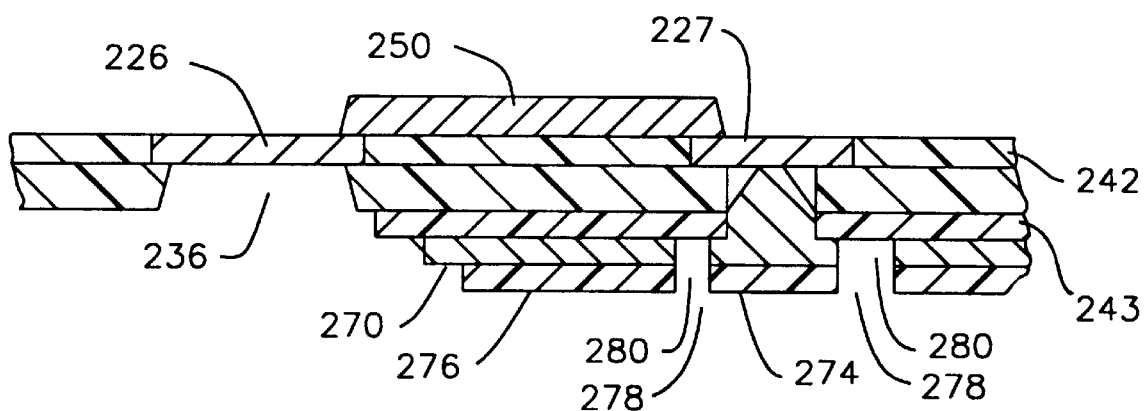
FIG. 14 is a view similar to FIG. 13 but depicting the component during a later stage of the same process.

In a further embodiment of the process, the dielectric support layer 232 (FIG. 13) is provided with an adhesive layer 242 on its top surface as discussed above with reference to FIGS. 1–4. In this embodiment, the dielectric layer is also provided with a further adhesive layer 243 on the opposite, bottom surface. In addition to the gaps 236, the dielectric layer is provided with numerous holes 237, of which only one is visible in FIG. 13. The first metal layer 220 is provided with gold strips 226 similar to the gold strips discussed above. In this arrangement, however, the gold plating process also forms connector spots 227. The first metal layer is laminated to the dielectric layer in the same manner as described above. In this lamination step, connector spots 227 are aligned with holes 237, whereas the gold strips are again aligned with the gaps 236.

A further etchable metal layer 270 is provided. Layer 270 has bonding bumps 272 disposed on a first side of the layer. Bumps 272 can be formed by plating or by patterned deposition of a solder paste or similar material. Bumps 272 are composed of a material adapted to bond with the gold in spots 227, such as a solder or tin or other metal adapted to form a eutectic with gold. Bumps 272 are disposed in a pattern corresponding to the pattern of holes 237. Further metal layer 270 also has terminal spots 274 on the second side of the layer, and a ground pattern 276 surrounding the terminal spots but separated therefrom by gaps 278. The terminal spots and ground pattern may be formed from an etch-resistant metal such as gold.

Further metal layer 272 is laminated to the dielectric layer 232 in the same lamination step as first metal layer 220. During this lamination step, the further metal layer 272 is bonded to dielectric layer 232 by adhesive 243. At the same time, bumps 272 enter holes 237 and engage connection spots 272. Bumps 272 form metallurgical bonds with the connection spots. After the lamination process strips of a resist 244 are applied on the surface of first metal layer 220 facing away from the dielectric layer. The assembly is then etched. The etchant again removes the first metal layer except in the regions covered by resist 244, leaving strips 250 of the first metal or copper connecting each gold or second metal strip 226 with one connection spot 227, and thereby forming composite leads. At the same time, the etchant attacks further metal layer at the gaps 278 in the ground pattern. This action from gaps 280 in layer 243, thereby electrically isolating each terminal spot 274 from the ground pattern. The resulting component thus has each composite lead connected to a terminal spot on the opposite side of the dielectric layer. In a further variant, bumps 272 can be replaced by deformable contacts. For example, deformable contacts such as those disclosed in commonly assigned, copending U.S. patent application Ser. No. 08/277, 336 filed Jul. 7, 1994 may be used. The disclosure of said '336 application is hereby incorporated by reference herein.

In a process according to a further embodiment of the invention, a first metal layer 320 such as a copper layer is selectively plated with a thin "flash" coating 317 (FIGS. 16 and 18) in areas on a first surface of the layer corresponding to terminal spots 339 and elongated strip-like lead portion 337. Flash coating 317 also extends over first bonding pad areas 341 contiguous with the elongated strip-like portions and second bonding pad areas 343 remote from the strip-like portions and first bonding pad areas. The first and second bonding pad areas 341 and 343 are disposed in rows spaced apart from one another with an empty area 345 therebetween. The thin, flash layer applied over all of these regions may incorporate a barrier layer of a metal such as nickel adapted to retard diffusion between gold and copper and an etch-resistant, bondable, precious metal such as gold over the barrier layer.

In the next step of the process, a wire bonding head 351 is actuated to dispense a fine, round gold wire 353 (FIG. 16) about 20 to about 30 microns in diameter, and to attach a length of the gold wire between each first bonding pad 341 and each second bonding pad 343. Bonding head 351 may be a conventional wire bonding head of the type normally used in making connections to semiconductor chips. The wire bonding head is first forcibly engaged with a first bonding pad area 341 and heat, vibration or both are applied to bond the tip of wire 353 to the first bonding pad area. Then, the tool is withdrawn and moved over to the second bonding pad area 343 while paying out the wire. When the tool reaches the second bonding pad area, heat, vibration and pressure are then applied again so as to bond the wire to the second bonding pad area, whereupon the tool is moved relative to the metal layer without paying out the wire so as to break the wire just beyond the second bonding pad area, leaving a length of wire connected between the first and second bonding pad areas. The bonding head 351 illustrated in FIG. 16 dispenses only a single wire, in the same manner as conventional bonding heads used for ordinary wire bonding operations. However, the bonding head may also be arranged to dispense numerous wires simultaneously. Thus, the wire bonding head may be adapted to dispense a number of wires equal to the number of first bonding pad areas 341 in a row, so that the bonding head can apply wires to an entire row in a single cycle. Also, more than one bonding head can be applied simultaneously in different areas of the sheet.

The individual lengths of wire 353 left by the bonding head or heads form strips 326 of gold, each such strip being bonded to the first or top surface of the first metal layer 320 at one first location or first bonding pad area 341 and at one second location or second bonding pad area 343 remote therefrom, but being unbonded to the sheet in the areas between the first and second bonding pads. Preferably, the motion of bonding head 351 is controlled so as to form strips 326 substantially straight and substantially horizontal, i.e., substantially parallel to the surface of layer 320.

In the next stage of the process, layer 320 is laminated to the top surface of a dielectric support 332 having gaps 336 therein so that each row of first bonding pad areas 341 lies on one side of a gap 336 whereas the corresponding row of second bonding pad areas 343 lie on the opposite side of the gap so that the strips or individual lengths of wire 326 extend across the gap. Thus, each wire is attached to the first metal layer at a first location 341 on one side of the gap and at a second location 343 on the opposite side of the gap. An adhesive layer 342 (FIG. 18) can be used between the second surface of first metal layer 320 and the top surface of dielectric support 332. At this stage, holes may be punched through both the first metal sheet 320 and the dielectric support layer 332 in corner regions so as to connect all the gaps into a single, continuous channel as described above. The assembly is then subjected to an etchant which removes those portions of the first metal layer 320 other than those protected by the etch-resistant flash layer. Selective removal of the first metal layer forms first metal strips 350 continuous with the second metal strips 326 and thus forms composite leads in the manner discussed above. Each first metal strip 350 includes a first bonding pad area 341 and an elongated region 337. A first end of each second metal strip or wire portion 326 is firmly anchored to the dielectric support layer 332 by the first metal strip. The second, opposite end of 326 is connected only to a relatively small region of the first metal layer corresponding to the small bonding pad 343. Because that bonding pad has a very small surface area, it is weakly attached to the dielectric support layer.

In the finished component, the lengths of wire 326 extend side-by-side, across the gap, above the top surface 333 of the dielectric layer 332. As best seen in FIG. 20, each wire portion 326, being round in a cross-section defines a pair of upwardly facing curved guide surfaces 371 and 373. When the component is bonded to a semiconductor chip or other microelectronic component, a tool 375 is advanced downwardly to engage each wire length and force it downwardly into the gap to engage it with a contact on the chip or other component. During this operation a guide surface 377 in the tool engages the wire and centers it under the tool. The guide surfaces 371 and 373 facilitate this engagement and centering action. As the tool moves downwardly, it forces the wire length 326 downwardly into the gap. The second end of each wire length, at the second bonding pad 343 is detached from the dielectric layer by release of the bonding pad 343 from the dielectric layer. Thus, the wires serve as the connection sections of composite leads in the manner discussed above. The round wire portions also provide good fatigue resistance in the finished assembly. Thus, after the connection sections or wire lengths are bonded to the contacts on the chip or other components, thermal effects will tend to cause repeated flexure of the wire lengths. The round cross-sectional shape of the wire length minimizes stress concentration during such flexure. The dielectric support layer may include a compliant layer 319 which faces toward the chip or other component when the dielectric support is assembled to the chip or other component. The compliant layer may be incorporated in the dielectric support before or after the other process steps discussed above, or may be formed in situ when the dielectric support is assembled to the microelectronic component. Solder balls 355 or other masses of electrically conductive joining material may be provided on the terminal spots 339 either before or after assembly of the connection component to the chip or other microelectronic element. These joining material masses are used to connect the terminal spots to a substrate after the connection component has been assembled to the chip or microelectronic element, thereby connecting the chip to the substrate.

In a process according to a further embodiment of the invention, the bonding pad areas 541 and 543 are covered by spots of an etch-resisting, bondable metal disposed on a first side of the first or etchable metal layer 520 (the side facing toward the bottom in FIG. 21) whereas the elongated portions 537 of the leads are covered by strip-like regions of an etch-resisting bondable metal 517 on the second, opposite side of the same layer, extending over the first bonding pad areas 541. Etch-resisting metal 517 on the second side of the metal layer also covers terminal spots 539. The wires or second metal strips 526 are connected between the first and second bonding pad areas, on the first side of first metal layer 520 using a wire bonder in the manner discussed above. After this operation, the sheet is laminated to the top surface of a dielectric support layer 532 with an adhesive layer 542 therebetween, so that the first surface of the first metal layer 520 bearing the second metal strips 526 faces towards the dielectric layer 532 and is engaged with the adhesive layer 542, as shown in FIG. 21. Following this step, the first metal layer 520 is etched away, leaving only those regions protected by the strip-like regions of etch-resistant metal 517 on the second surface, thereby forming strip-like first metal leads 537 and terminal spots 539. Each wire portion or second metal strip 526 remains continuous with one strip-like lead 537 formed from the first metal layer, and is supported on both sides of the gap. In this arrangement, the first metal layer at the second bonding pad 543 is not covered by an etch-resistant metal on the side facing away from the dielectric support. Thus, the first metal layer is removed in this area as well, leaving the second end of the wire length or strip 526 only weakly held by adhesive 542, whereas the first end is anchored by the strip-like lead first metal lead portion 537.

According to further embodiments of the invention, the first metal layer may be laminated to the bottom side of a dielectric support layer, and the terminal spots may be exposed by forming vias through the dielectric support layer. In the embodiment of FIG. 22, the first or strip-bearing side of the first metal layer 620 is laminated to the bottom side of dielectric layer 632, so that the second metal strips or wires 626 are embedded in an adhesive layer 642 on the bottom surface. As in the embodiment of FIG. 21, the first metal layer has an etch-resistant metal 617 on the second side of the metal layer, facing away from the dielectric layer in the regions corresponding to strip-like leads 637 and terminal spots 639. After assembly of metal layer to the dielectric layer, but before compliant layer 619 is added, metal layer 620 is etched so as to leave strips 637, first bonding pads 641 and terminal spots 639. The dielectric layer is ablated or etched away at locations in registry with terminal spots 639, thus forming vias 653 extending through the dielectric layer in registry with the terminal spots and leaving the terminal spots exposed to the top surface of the dielectric layer. Joining material masses 655 contact terminal spots 639 through vias 653. The vias may be lined with conductive materials other than the joining material, as by plating or otherwise depositing metals in the vias, so as to provide a conductive pathway from the each terminal spot to the top surface of the dielectric layer. The via-forming step may be performed before or after the metal layer is assembled to the dielectric layer, and before or after the etching step. The vias may be formed by the same process used to form the gaps 636 in the dielectric layer. If the via-forming step is performed before the etching step, then the first metal layer may be provided with an etch-resistant metal overlying each bonding spot 639 on the first surface of metal layer 620, facing toward the dielectric layer, so that the bonding spots are not etched through the vias.

In the embodiment of FIG. 23, the first metal layer 720, is laminated to the bottom surface of dielectric layer 732 using an adhesive layer 742 on the bottom surface. As in the embodiment of FIGS. 15–20, however, the first surface of the first metal layer with the strips or wires 726 thereon faces downwardly, away from the dielectric layer. The first metal layer 720 has etch-resistant, bondable metal on its first surface, in areas corresponding to strips 737, terminal spots 739 and first bonding pads 741 contiguous with the strips, and second bonding pads 743 remote from the strips. The strips or wires 726 are connected between the bonding pads before lamination to the dielectric layer, and the first metal layer is etched to the configuration illustrated in FIG. 23 after lamination. The dielectric layer 732 and adhesive layer 742 are etched or ablated to form vias 753, either before or after lamination, to form vias extending from the terminal spots 739 to the top surface of layer 732.

A component in accordance with a further embodiment of the present invention is manufactured by first forming the individual, separate lead portions 850 on a dielectric layer 832 having gaps 836 therein. Thus, the lead portions may be formed by applying a continuous layer of the first metal 820 with etch-resistant/metal layers as discussed above, laminating this sheet to the dielectric layer and then etching the metal sheet so as to leave the flash-covered regions on the dielectric. Here again, the flash-covered regions include first bonding pad areas 841 contiguous with the strip-like lead portions 850 and second bonding pad areas 843 isolated from the first bonding pad areas and strip-like lead portions, the first and second bonding pad areas being disposed on opposite sides of gaps 836. After selective removal of the first metal layer, the first metal strips or wire lengths 826 are applied by a wire bonding process similar to that discussed above with reference to FIGS. 15–20. In a further variant, the lead portions 850 and bonding pad areas 841 and 843 in this embodiment can be fabricated by selecting deposition onto the dielectric layer, rather than selective removal of the first metal sheet.

In a further embodiment, the etchable first metal layer 920 may be formed with strip-like flash regions 937, first bonding pad areas 941 and second bonding pad areas 943 as discussed above. The strips of the second metal may be provided in an array on a carrier sheet 981 formed from a material such as stainless steel selected so that the second metal utilized in the strip 926 does not strongly bond to it. Strips 926 may be deposited in the array by masking and electroplating onto the stainless steel carrier sheet. The configuration of the array corresponds to the required placement of the strips in the final product. Carrier sheet 981 and first metal layer 920 are brought together under heat and pressure, so that the second metal strips 926 bond with the flash layers in the bonding pad areas 941 and 943. A bonding material such as a diffusion bonding alloy may be provided at each of the bonding pad areas to assure that the second metal strips bond strongly with the flash layers. Suitable diffusion bonding alloys for use with gold second metal strip 926 include tin, silicon, germanium and alloys and combinations thereof. When the carrier sheet 981 is brought together with the first metal layer 920 under heat and pressure, all of the second metal strips in the array are bonded to the corresponding bonding pad areas simultaneously. After bonding, the carrier sheet is stripped away, leaving the second metal strips in position on the first metal layer. The first metal layer is then laminated with a dielectric supporting layer as discussed above and etched.

In a process according to a further embodiment of the invention, a first metal layer 1020 is provided with an etch-resistant bondable metal at terminal spots 1039, and end bonding pads 1043. Wires 1026 formed from a second metal are connected between terminal spots 1039 and end bonding pads 1043. Layer 1020 is assembled with a dielectric support layer 1032, and one or more gaps 1036 are provided in the dielectric support. The gaps can be formed before or after assembly of the metal layer to the dielectric layer. The gaps, terminals spots and end bonding pads are arranged so that each end bonding pad 1043 lies on the opposite side of a gap 1036 from the associated terminal spot. Thus, each wire is connected to the first metal layer at a first location on one side of the gap, and at a second location on the opposite side of the gap. Each second metal wire forms an entire lead. After assembly to the dielectric layer, the metal layer is etched, leaving the terminal spots 1036, end bonding pads 1043 and leads in place, and leaving the wires electrically isolated from one another. Each such lead has a connection section 1027 extending across a gap in the dielectric layer. This section of the lead can be engaged by a bonding tool during assembly to the chip or other microelectronic element, in the same manner as discussed above. Preferably, each end bonding pad 1043 is small and hence detaches readily from the dielectric layer during this process. As shown in FIG. 26, the connection sections 1027 need not be parallel to one another.

Optionally, first metal layer 1020 may be provided with intermediate bonding pads 1041 on the same side of a gap 1036 as terminal spots 1039. Thus, some or all of the leads may extend from terminal spots 1039 to intermediate bonding pads 1041 and from the intermediate bonding pads to the end bonding pads 1043. In this arrangement as well, each wire is bonded to the first metal layer at a first location 1041 on one side of a gap, and at a second location 1043 on the opposite side of the gap. The intermediate bonding pads may be larger than the end bonding pads, so as to provide a permanent anchor for the lead. The metal layer 1020 may be assembled to the dielectric layer in any of the orientations shown in FIGS. 18, 21, 22 or 23, i.e., with the first or wire-bearing surface facing towards or away from the dielectric layer, and with the metal layer on top of the dielectric layer or beneath the dielectric layer. In some of these orientations, the ends of the wires at the terminal spots can be immersed in the solder applied to the terminal spots. To prevent dissolution of the wire in the solder or weakening of the wire by the solder, a barrier metal can be applied over these ends of the wires.

As numerous variations and combinations of the features described above may be utilized without departing from the invention, the foregoing description of the preferred embodiments should be understood as merely illustrating the invention as defined in the claims, rather than as limiting the invention.

What is claimed is:

1. A method of making a connection component for a microelectronic element comprising the steps of:
   (a) providing a substantially continuous layer of a first metal;
   (b) selectively depositing a plurality of conductor portions of a second metal on said first metal by attaching separately formed strips of said second metal to said first metal layer;
   (c) providing a dielectric support juxtaposed with said continuous layer of said first metal;
   (d) selectively removing said first metal from said layer of said first metal after said selective depositing step to form a plurality of conductor portions of said first metal contiguous with said conductor portions of said second metal and thereby form a plurality of composite leads each including conductor portions of said first and second metals connected to one another.

2. A method as claimed in claim 1 wherein said step of attaching strips includes the step of attaching said strips of said second metal to said first metal layer at spaced-apart bonding pad areas of said first metal layer.

3. A method as claimed in claim 2 wherein each said strip of said second metal is attached to said first metal layer at a first bonding pad area and at a second bonding pad area, and wherein said step of selectively removing said first metal layer is performed so as to form lead portions contiguous with each first bonding pad area and to leave each second bonding pad area isolated.

4. A method as claimed in claim 2 wherein said step of attaching said strips includes the step of dispensing lengths of a wire incorporating said second metal.

5. A method as claimed in claim 4 wherein said wire is at least partially round in cross-section.

6. A method as claimed in claim 2 further comprising the step of selectively applying one or more flash layers on said bonding pad areas before attaching said strips thereto.

7. A method as claimed in claim 1 further comprising the step of forming vias extending through said dielectric support layer in registry with said composite leads.

8. A method as claimed in claim 7 wherein said composite leads are formed on a one surface of said dielectric layer, the method further comprising the step of forming terminals on an opposite surface of said dielectric layer and electrically connecting said terminals to said composite leads through said vias.

9. A method as claimed in claim 8 wherein said step of forming terminals on said opposite surface includes the steps of laminating a further metal sheet to said opposite surface of said dielectric layer and etching said further metal sheet to form individual terminals, said step of connecting said terminals to said composite leads including the step of connecting said sheet to said first metal layer through said vias.

10. A method as claimed in claim 9 wherein said step of connecting said further metal sheet to said first metal layer is performed during one said lamination step.

11. A method of making a connection component for a microelectronic element comprising the steps of:
   (a) providing a substantially continuous layer of a first metal;
   (b) providing a dielectric support having a first surface juxtaposed with said continuous layer of said first metal; then
   (c) selectively removing said first metal to form a plurality of first bonding pads, a plurality of second bonding pads and a plurality of conductor portions of said first metal continuous with said first bonding pads, said first and second bonding pads being on said first surface of said dielectric support; and then
   (d) attaching a strip of a second metal between each first bonding pad and a second bonding pad to thereby form a plurality of composite leads each including conductor portions of said first and second metals connected to one another.

12. A method as claimed in claim 11 wherein said step of attaching said strips includes the step of dispensing lengths of a wire incorporating said second metal.

13. A method as claimed in claim 12 wherein said wire is at least partially round in cross-section.

14. A method as claimed in claim 11 further comprising the step of selectively applying one or more flash layers on said bonding pads before attaching said strips thereto.

15. A method of making a connection component for a microelectronic device comprising the steps of:
   (a) connecting a plurality of wires between a plurality of first locations and a plurality of second locations on a first surface of a first metal layer so that each wire extends between one said first location and one said second location;
   (b) laminating said first metal layer to a dielectric support layer;
   (c) providing one or more gaps in said dielectric support layer so that the first location and the second location connected to each said wire lie on opposite sides of one said gap, whereby each said wire has a connection section of each said wire extending across one said gap; and (d) etching away said first metal layer so as to isolate said wires from one another.

16. A method as claimed in claim 15 further comprising the step of providing an etch-resistant bonding material on said first metal layer at said first and second locations, said bonding step including the steps of bonding said wires to said etch-resistant bonding material.

17. A method as claimed in claim 16 wherein said laminating step is performed so that said first surface faces away from said dielectric layer and so that said etch-resistant bonding material and said dielectric layer protect portions of said first metal layer at said first and second locations during said etching step.

18. A method as claimed in claim 15 wherein said laminating step is performed so that said first surface faces toward said dielectric layer, the method further comprising the step of providing an etch-resistant material on said second surface of said first metal layer at least one said location connected to each wire to protect said first metal during said etching step.

19. A method as claimed in claim 15 wherein each said wire forms the entirety of a lead.

* * * * *

UNITED STATES PATENT AND TRADEMARK OFFICE
CERTIFICATE OF CORRECTION

PATENT NO. : 5,807,453
DATED : September 15, 1998
INVENTOR(S) : Smith et al.

It is certified that error appears in the above-identified patent and that said Letters Patent is hereby corrected as shown below:

Column 1, line 8, "08/1,434,552" should read --08/434,552--.

Column 8, line 56, "-a" should read --a--.

Column 12, line 62, "7," should read --19,--

Signed and Sealed this

Twelfth Day of January, 1999

Attest:

Attesting Officer

*Acting Commissioner of Patents and Trademarks*